United States Patent
Chooi et al.

(10) Patent No.: US 6,350,675 B1
(45) Date of Patent: Feb. 26, 2002

(54) INTEGRATION OF SILICON-RICH MATERIAL IN THE SELF-ALIGNED VIA APPROACH OF DUAL DAMASCENE INTERCONNECTS

(75) Inventors: Simon Chooi; Mei-Sheng Zhou; Subhash Gupta; Yi Xu, all of Singapore (SG)

(73) Assignee: Chartered Semiconductor Manufacturing Ltd., Singapore (SG)

(*) Notice: Subject to any disclaimer, the term of this patent is extended or adjusted under 35 U.S.C. 154(b) by 0 days.

(21) Appl. No.: 09/686,282

(22) Filed: Oct. 12, 2000

(51) Int. Cl.$^7$ .......................................... H01L 21/4763
(52) U.S. Cl. ..................... 438/624; 438/637; 438/638; 438/666; 438/687
(58) Field of Search .................................. 438/624, 637, 438/638, 666, 687

(56) References Cited

U.S. PATENT DOCUMENTS

| | | | |
|---|---|---|---|
| 5,741,626 A | 4/1998 | Jain et al. | 430/314 |
| 5,877,075 A | 3/1999 | Dai et al. | 438/597 |
| 5,906,911 A | 5/1999 | Cote | 430/316 |
| 5,935,762 A | 8/1999 | Dai et al. | 430/312 |
| 6,107,177 A * | 8/2000 | Lu et al. | 438/624 |
| 2001/0012689 A1 * | 8/2001 | Okoroanyanwu et al. | 438/637 |

* cited by examiner

Primary Examiner—John F. Niebling
Assistant Examiner—Lynne Gurley
(74) Attorney, Agent, or Firm—George O. Saile; Rosemary L. S. Pike

(57) ABSTRACT

This invention relates to a method of fabrication used for semiconductor integrated circuit devices, and more specifically, in the formation of self-aligned dual damascene interconnects and vias, which incorporates low dielectric constant intermetal dielectrics (IMD) and utilizes silylated top surface imaging (TSI) photoresist, with a single or multi-step selective reactive ion etch (RIE) process, to form trench/via opening. The invention incorporates the use of a silylated top surface imaging (TSI) resist etch barrier layer to form the via pattern, in the first level of a dual damascene process. Two variations of using the top surface imaging (TSI) resist, with and without leaving an exposed region in place, are described in the first and second embodiment of the invention, and in addition, a thin dielectric layer is made use of just below the resist layer. Provided adhesion between the top surface imaging (TSI) photoresist and the low dielectric constant intermetal dielectric (IMD) is good, the thin dielectric layer described above can be omitted, yielding the third and fourth embodiment of the invention. Special attention in the process is given to protecting the integrity of the low dielectric constant intermetal dielectric (ILD) material, selected from the group consisting of organic based or carbon doped silicon dioxide.

44 Claims, 5 Drawing Sheets

INTEGRATION OF SILICON-RICH MATERIAL IN THE SELF-ALIGNED VIA APPROACH OF DUAL DAMASCENE INTERCONNECTS

BACKGROUND OF THE INVENTION (1) Field of the Invention

This invention relates to a method of fabrication used for semiconductor integrated circuit devices, and more specifically, in the formation of self-aligned dual damascene interconnects and vias, which incorporates low dielectric constant intermetal dielectrics (IMD) and utilizes silylated top surface imaging (TSI) photoresist, with a single or multi-step selective reactive ion etch (RIE) process, to form trench/via opening.

(2) Description of the Related Art

As a background to the current invention, the damascene processing is an alternative method for fabricating planar interconnects. Damascene wiring interconnects (and/or studs) are formed by depositing a dielectric layer on a planar surface, patterning it using photolithography and oxide reactive ion etch (RIE), then filling the recesses with conductive metal. The excess metal is removed by chemical mechanical polishing (CMP), while the troughs or channels remain filled with metal. For example, damascene wiring lines can be used to form bit lines in DRAM devices, with processing similar to the formation of W studs in the logic and DRAM devices.

Key to the damascene processing approach is that the deposited conductive metal is deposited into a previously deposited patterned insulator. This is desirable because mask alignment, dimensional control, rework, and the etching process are all easier when applied to a dielectric rather than metal films. Damascene processing achieves these benefits by shifting the enhanced filling and planarization requirements from dielectric to metal films, and by shifting control over interconnect thickness from metal deposition to insulator patterning and metal CMP.

It remains a challenge in dual damascene processing to avoid damage to low dielectric constant insulators, i.e., organically based or carbon doped silicon dioxide materials. One significant problem is the degradation of the low dielectric constant materials during photoresist stripping with oxygen plasma ashing, wherein oxygen free radials react with carbon and hydrogen contained in low dielectric materials. Especially when patterning a via opening in the first level of a dual damascene, utilizing conventional photoresist processes, other deleterious effects can also occur to the low dielectric constant materials, e.g., bowing, profile distortion, increase in dielectric constant, and via poisoning are just some degradation effects. In addition, etching of via etch stop layers, i.e., silicon nitride, can cause gouging of the low dielectric constant organic material just below the stop layer. Post-etch solvent cleaning after the low dielectric material etch, can also attack the nitride stop layer/low dielectric constant material interface.

The related Prior Art background patents will now be described in this section.

U.S. Pat. No. 5,935,762 entitled "Two-Layered TSI Process for Dual Damascene Patterning" granted Aug. 10, 1999 to Dai et al. describes a method for forming dual damascene patterns using a silylation process. A substrate is provided with a tri-layer of insulation formed thereon. A first layer of silylation photoresist is formed on the substrate and is imaged with a hole pattern by exposure through a mask. The hole pattern is then etched in the first photoresist. A second layer of photoresist is formed, and is imaged with a line pattern aligned with the previous hole pattern by exposure through a mask. The line pattern in the second photoresist is etched. The hole pattern in the first photoresist is transferred into the top layer of composite insulation first and then into the middle etch-stop layer by successive etching. Through a series of process steps, hole and line patterns are formed in the insulation layer, and metal is deposited in a dual damascene process.

U.S. Pat. No. 5,877,075 entitled "Dual Damascene Process Using Single Photoresist Process" granted Mar. 2, 1999 to Dai et al. describes a dual damascene process using a silylation process with a single photoresist process. A substrate is provided with a tri-layer of insulation formed thereon. A layer of photoresist is formed on the substrate and is imaged with a hole pattern by exposure through a dark field mask. Hole is formed in the photoresist by a wet etch. As a key step, the photoresist is next subjected to post-exposure bake such that the sensitivity of the photoresist is still retained. The same photoresist layer is then exposed for the second time for aligned line patterning using a "clear-field" mask. The line patterned region is cross-linked by performing pre-silylation bake, which region in turn is not affected by the subsequent silylation process that forms a silicon rich mask in the field surrounding the hole and line patterns. Through a series of process steps, hole and line patterns are formed in the insulation layer, and metal is deposited in a dual damascene process.

U.S. Pat. No. 5,741,626 entitled "Method for Forming a Dielectric Tantalum Nitride Layer as an Antireflective Coating (ARC)" granted Apr. 21, 1998 to Jain et al. describes a process with an anti-reflective $Ta_3N_5$ coating which can be used in a dual damascene structure and for I line or G line lithographies. In addition, the $Ta_3N_5$ coating may also be used as an etch stop and a barrier layer. A dual damascene structure is formed by depositing a first dielectric layer. A dielectric tantalum nitride layer is deposited on top of the first dielectric layer. A second dielectric layer is deposited on the tantalum nitride layer. A dual damascene opening is etched into the dielectric layers by patterning a first opening portion and a second opening portion using photolithography operations.

U.S. Pat. No. 5,906,911 entitled "Process of Forming a Dual Damascene Structure in a Single Photoresist Film" granted May 25, 1999 to Cote describes a dual damascene process using just one single layer of photoresist with two photomasks and selective silylation. The process includes the steps of forming a photoresist film on a substrate, pattern exposing the photoresist film to form a first pattern in the photoresist film, and forming an etch resistant layer in the first pattern. The photoresist film is pattern exposed a second time to form a second pattern in the photoresist film. After several more process steps and etching, dual damascene trench and via opens are formed.

SUMMARY OF THE INVENTION

It is a general object of the present invention to provide an improved method of forming semiconductor integrated circuit devices, and more specifically, in the formation of self-aligned dual damascene interconnects and vias, which incorporates low dielectric constant intermetal dielectrics (IMD) and utilizes silylated top surface imaging (TSI) photoresist, with a single or multi-step selective reactive ion etch (RIE) process, to form trench/via opening. The unexposed resist regions are removed by selective etching of this non-silylated material using either an oxygen plasma, or $SO_2$ or $SO_3$, plasmas or gases.

The low dielectric constant materials, utilized in this invention, consist of either an organic based material or a carbon doped silicon dioxide, and various combinations of the organic based material and carbon doped silicon dioxide. The organic based materials consists of, but are not restricted to, polyimide, "FLARE" (source Allied Signal, now Honeywell), "SILK" (source Dow Chemical).

In the first embodiment of this invention, provided are the following: a semiconductor silicon substrate with an interlayer dielectric (ILD) layer thereon, with a level of metal wiring being defined and embedded in a layer of insulator. The first embodiment of the present invention starts with these conventional layers being provided. A bottom passivation layer is deposited on the metal wiring layer. Next, a low dielectric constant material layer is deposited on the bottom passivational layer. The low dielectric constant material consists of either an organic based material or a carbon doped silicon dioxide. In the first embodiment of this invention, a thin dielectric layer is deposited over the first layer of low dielectric constant material. The thin dielectric layer is selected from the group consisting of silicon dioxide, silicon nitride, silicon carbide, and silicon oxynitride. Next, top surface imaging (TSI) resist is placed over the thin dielectric layer. The resist is exposed to ultraviolet radiation, wavelength less than 248 nm, and using a photo mask, exposed regions and unexposed regions are formed. The exposed resist regions, later on in the process, become an etch stop for subsequent via formation, while the unexposed resist regions define the subsequent via opening.

The next set of process steps are key to the first embodiment of the present invention. The top surface imaging (TSI) resist, exposed regions are silylated becoming silicon rich containing material. The silylation is performed using HMDS (hexamethyldisilazane), in vapor phase, although solutions of 10% HMCTS (hexamethylcyclotrisilazane in xylene) can also cause the resist to be silylated. Next, a second layer of low dielectric constant material is deposited on the top surface imaging (TSI) resist, exposed silylated resist region and unexposed non-silylated resist region. As before, the low dielectric constant material consists of either an organic based material or a carbon doped silicon dioxide. Next, a cap layer of silicon nitride is deposited on the second layer of low dielectric constant material. Photoresist is applied and patterned over the cap layer, for subsequent trench opening in a dual damascene process. Note, that at this stage in the first embodiment of the present invention, both via region and trench region are now pattern defined for subsequent etching and trench/via opening in dual damascene processing.

The final set of process steps in the first embodiment of this invention are now described. A single or multi-step selective etching, reactive ion etch (RIE), is now performed, which is patterned by photoresist for a trench opening and silylated resist for an aligned via opening. The combined etching of the trench and via selectively etches through the top cap layer and through the second low dielectric layer. In addition, the unexposed resist, organic in nature, is selectively etched away. The silylated resist regions are resistant to the etch and act as a mask, patterning the opening for the via. Both exposed portions of the thin dielectric layer and exposed portions of the first layer of low dielectric material, are selectively etched away, stopping on the bottom passivation layer. Hence, after the selective etch and post etch cleaning, both trench opening and via opening are simultaneously formed for dual damascene processing. Subsequent dual damascene processing steps include: removal of the bottom passivation material in the contact via region and deposition of copper with removal of the excess copper by chemical mechanical polish (CMP), thus forming inlaid copper interconnects and contact vias.

In the second embodiment of this invention, provided are the following: a semiconductor silicon substrate with an interlayer dielectric (ILD) layer thereon, with a level of metal wiring being defined and embedded in a layer of insulator. The second embodiment of the present invention starts with these conventional layers being provided. A bottom passivation layer is deposited on the copper wiring layer. Next, a low dielectric constant material layer is deposited on the bottom passivation layer. The low dielectric constant material consists of either an organic based material or a carbon doped silicon dioxide. In the second embodiment of this invention, a thin dielectric layer is deposited over the first layer of low dielectric constant material. The thin dielectric layer is selected from the group consisting of silicon dioxide, silicon nitride, silicon carbide, and silicon oxynitride. Next, top surface imaging (TSI) resist is placed over the thin dielectric layer. The resist is exposed to ultraviolet radiation, wavelength less than 248 nm, and using a photo mask, exposed regions and unexposed regions are formed. The exposed resist regions, later on in the process, become an etch stop for subsequent via formation. The top surface imaging (TSI) resist is silylated becoming silicon rich containing material. The silylation is performed using HMDS (hexamethyldisilazane), in vapor phase, although solutions of 10% HMCTS (hexamethylcyclotrisilazane in xylene) can also cause the resist to be silylated. The unexposed resist regions are removed by selective etching of this non-silylated material using either an oxygen plasma, or $SO_2$ or $SO_3$, plasmas or gases. Note, that this process then defines the subsequent via opening. The sensitive organic low dielectric constant material is protected from this etch process by the thin dielectric.

The next set of processing steps in the second embodiment of the present invention are now summarized. A second layer of low dielectric constant material is deposited on the top surface imaging (TSI) resist, that is, the exposed silylated resist region and over the thin dielectric layer. As before, the low dielectric constant material consists of either an organic based material or a carbon doped silicon dioxide. Next, a cap layer of silicon nitride is deposited on the second layer of low dielectric constant material. Photoresist is applied and patterned over the cap layer for subsequent trench opening, in a dual damascene process. Note, that at this stage in the second embodiment of the present invention, both via region and trench region are now pattern defined for subsequent etching and trench/via opening in dual damascene processing.

The final set of process steps in the second embodiment of this invention are now described. A single or multi-step selective etching, reactive ion etch (RIE), is performed which is patterned by photoresist for trench opening and silylated resist for an aligned via opening. The single or multi-step selectively etches through the top cap layer and through the second low dielectric layer. The silylated resist regions are resistant to the etch and act as a mask, patterning the opening for the via. Both exposed portions of the thin dielectric layer and exposed portions of the first layer of low dielectric material, are selectively etched away, stopping on the bottom passivation layer. Hence, after the selective etch and post etch cleaning, trench opening and via opening are simultaneously formed for dual damascene processing. Subsequent dual damascene processing steps include: removal of the bottom passivation material in the contact via region and deposition of copper with removal of the excess copper by chemical mechanical polish (CMP), thus forming inlaid copper interconnects and contact vias.

In the third embodiment of this invention, provided are the following: a semiconductor silicon substrate with an interlayer dielectric (ILD) layer thereon, with a level of metal wiring being defined and embedded in a layer of insulator. The third embodiment of the present invention starts with these conventional layers being provided. A bottom passivation layer is deposited on the metal wiring layer. Next, a low dielectric constant material layer is deposited on the bottom passivation layer. The low dielectric constant material consists of either an organic based material or a carbon doped silicon dioxide. In the third embodiment of this invention, a layer of thin dielectric utilized earlier is omitted, provided adhesion between the first layer of low dielectric constant material, mentioned above, and subsequent resist material, is adequate. Next, top surface imaging (TSI) resist is placed on the low dielectric constant material layer. The resist is exposed to ultraviolet radiation, wavelength less than 248 nm, and using a photo mask, exposed regions and unexposed regions are formed. The exposed resist regions, later on in the process, become an etch stop for subsequent via formation, while the unexposed resist regions define the subsequent via opening.

The next set of process steps are key to the third embodiment of the present invention. The top surface imaging (TSI) resist, exposed regions are silylated becoming silicon rich containing material. The silylation is performed using HMDS, (hexamethyldisilazane), in vapor phase, although solutions of 10% HMCTS (hexamethylcyclotrisilazane in xylene) can also cause the resist to be silylated. Next, a second layer of low dielectric constant material is deposited on the top surface imaging (TSI) resist, exposed silylated resist region and unexposed non-silylated resist region. As before, the low dielectric constant material consists of either an organic based material or a carbon doped silicon dioxide. Next, a cap layer of silicon nitride is deposited on the second layer of low dielectric constant material. Photoresist is applied and patterned over the cap layer, for subsequent trench opening in a dual damascene process. Note, that at this stage in the third embodiment of the present invention, both via region and trench region are now pattern defined for subsequent etching and trench/via opening in dual damascene processing.

The final set of process steps in the third embodiment of this invention are now described. A single or multi-step selective etching, reactive ion etch (RIE), is performed, which is patterned by photoresist for trench opening and silylated resist for an aligned via opening. The single or multi-step selectively etches through the top cap layer and through the second low dielectric layer. In addition, the unexposed resist, organic in nature, is selectively etched away. The silylated resist regions are resistant to the etch and act as a mask, patterning the opening for the via. Exposed portions of the first layer of low dielectric material, are selectively etched away, stopping on the bottom passivation layer. Hence, after the selective etch and post etch cleaning, trench opening and via opening are simultaneously formed for dual damascene processing. Subsequent dual damascene processing steps include: removal of the bottom passivation material in the contact via region and deposition of copper with removal of the excess copper by chemical mechanical polish (CMP), thus forming inlaid copper interconnects and contact vias.

In the fourth embodiment of this invention, provided are the following: a semiconductor silicon substrate with an interlayer dielectric (ILD) layer thereon, with a level of metal wiring being defined and embedded in a layer of insulator. The fourth embodiment of the present invention starts with these conventional layers being provided. A bottom passivation layer is deposited on the copper wiring layer. Next, a low dielectric constant material layer is deposited on the bottom passivation layer. The low dielectric constant material consists of either an organic based material or a carbon doped silicon dioxide. In the fourth embodiment of this invention, a layer of thin dielectric utilized earlier is omitted, provided adhesion between the first layer of low dielectric constant material, mentioned above, and subsequent resist material, is adequate. Next, top surface imaging (TSI) resist is placed on the low dielectric constant material layer. The resist is exposed to ultraviolet radiation, wavelength less than 248 nm, and using a photo mask, exposed regions and unexposed regions are formed. The exposed resist regions, later on in the process, become an etch stop for subsequent via formation, while the unexposed resist regions define the subsequent via opening. The top surface imaging (TSI) resist is silylated becoming silicon rich containing material. The silylation is performed using HMDS (hexamethyldisilazane), in vapor phase, although solutions of 10% HMCTS (hexamethylcyclotrisilazane in xylene) can also cause the resist to be silylated. The unexposed resist regions are removed by selective etching of this non-silylated material using $SO_2$ or $SO_3$, plasmas or gases. Note, that this process then defines the subsequent via opening. The sensitive organic low dielectric constant material is now exposed to etching in this process, hence the designated use of $SO_2$ or $SO_3$, in plasmas, or gases, is specified.

The next set of processing steps in the fourth embodiment of the present invention are now summarized. A second layer of low dielectric constant material is deposited on the top surface imaging (TSI) resist, that is, exposed silylated resist region and on the exposed portion of the first low dielectric material. As before, the low dielectric constant material consists of either an organic based material or a carbon doped silicon dioxide. Next, a cap layer of silicon nitride is deposited on the second layer of low dielectric constant material. Photoresist is applied and patterned over the cap layer for subsequent trench opening, in a dual damascene process. Note, that at this stage in the fourth embodiment of the present invention, both via region and trench region are now pattern defined for subsequent etching and trench/via opening in dual damascene processing.

The final set of process steps in the fourth embodiment of this invention are now summarized. A single or multi-step selective etching, reactive ion etch (RIE), is performed which is patterned by photoresist for trench opening and silylated resist for via opening. The single or multi-step selectively etches through the top cap layer and through the second low dielectric layer. The silylated resist regions are resistant to the etch and act as a mask, patterning the opening for the via. Exposed portions of the first layer of low dielectric material, are selectively etched away, stopping on the bottom passivation layer. Hence, after the selective etch and post etch cleaning, trench opening and via opening are simultaneously formed for dual damascene processing. Subsequent dual damascene processing steps include: removal of the bottom passivation material in the contact via region and deposition of copper with removal of the excess copper by chemical mechanical polish (CMP), thus forming inlaid copper interconnects and contact vias.

This invention has been summarized above and described with reference to the preferred embodiments. Some processing details have been omitted and are understood by those

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

It is a general object of the present invention to provide a new and improved method of forming semiconductor integrated circuit devices, and more specifically, in the formation of self-aligned dual damascene interconnects and vias, which incorporates low dielectric constant intermetal dielectrics (IMD) and utilizes silylated top surface imaging (TSI) photoresist, with a single or multi-step selective reactive ion etch (RIE) process, to form trench/via opening.

Figure 1A:
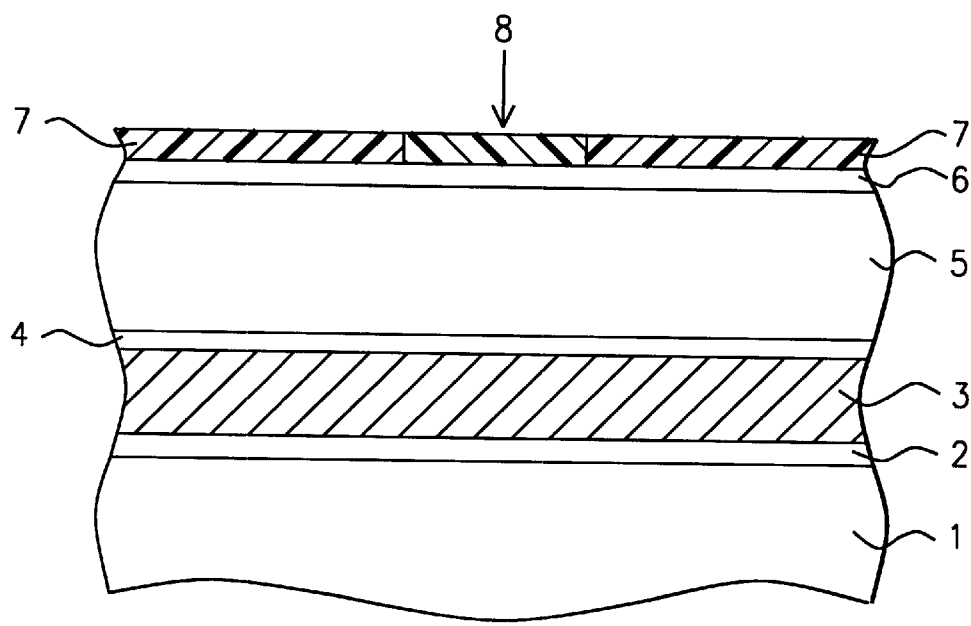
FIGS. 1A–1B, which in cross-sectional representation illustrate the first part of the method in the first embodiment of the present invention.

Referring to FIG. 1A, which in cross-sectional representation, shows a semiconductor silicon substrate 1 with an interlayer dielectric (ILD) layer 2 and with the first level of metal wiring 3 being defined, embedded in a layer of insulator (not shown in Figs.). In first embodiment of the present invention and subsequent embodiments in this invention, the substrate 1 is preferably composed of monocrystalline silicon. Other materials for the substrate include silicon-on-insulator and silicon-germanium. Semiconductor device structures, such as, gate electrodes, source and drain regions, contact holes (not shown in Figs.) may be formed in and on the semiconductor substrate. The semiconductor substrate may also contain dielectric and insulating materials (not shown in Figs). Furthermore, the metal wiring 3 comprises one or more conductors chosen from a group consisting of Cu, Al, Al alloys, Ti, TiN, Ta, TaN, and W. In the present invention, the metal wiring 3 is preferably Cu and TaN, and is specified as Cu.

A bottom passivation layer 4 is deposited to a thickness of between 100 to 5,000 Angstroms on the metal wiring layer 3. The bottom passivation layer 4 includes, but is not restricted to, silicon nitride, silicon oxynitride, barrier low K material ("BLOK", source Applied Materials), and silicon carbide. The bottom passivation layer 4 becomes optional, if the wiring layer 3 consists of an Al alloy, e.g., Ti/TiN/Al alloy /TiN.

Next, a low dielectric constant material layer 5 is deposited to a thickness of between 2,000 to 10,000 Angstroms on the bottom passivation layer 4. The low dielectric constant material 5 consists of either an organic based material or a carbon doped silicon dioxide, and various combinations of the organic based material and carbon doped silicon dioxide. The organic based materials consists of, but are not restricted to, polyimide, "FLARE" (source Allied Signal, now Honeywell), "SILK" (source Dow Chemical). In the first embodiment of this invention, a thin dielectric layer 6 is deposited to a thickness of between 100 to 5,000 Angstroms over the first layer of low dielectric constant material 5. The thin dielectric layer (6) includes, but is not restricted to, silicon dioxide, silicon nitride, boron nitride, silicon carbide, barrier low K material ("BLOK", source Applied Materials), and silicon oxynitride. Next, top surface imaging (TSI) resist is placed over the thin dielectric layer 6, resist thickness of between 100 to 5,000 Angstroms. The resist is exposed to ultraviolet radiation, wavelength less than 248 nm, and using a photo mask, exposed regions (7) and unexposed regions (8) are depicted in FIG. 1A. The exposed resist regions (7), later on in the process, become an etch stop for subsequent via formation, while the unexposed resist regions (8) define the subsequent via opening.

Figure 1B:
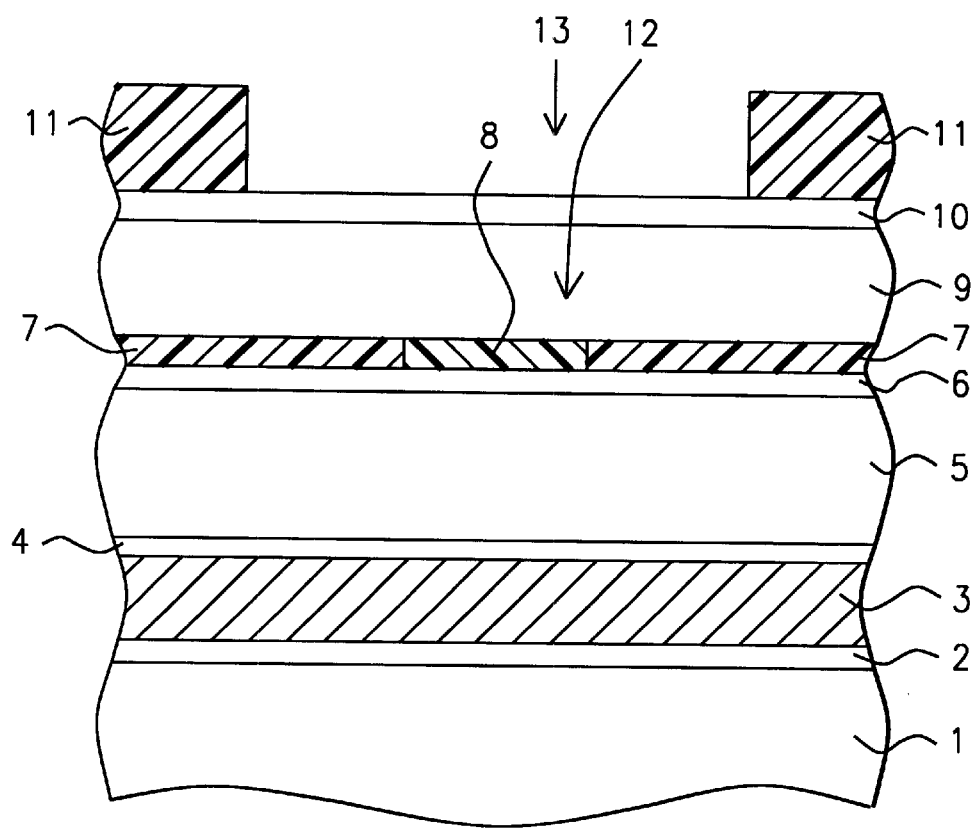

Referring to FIG. 1B, which in cross-sectional representation, shows the next set of processing steps in the first embodiment of the present invention. The top surface imaging (TSI) resist, exposed regions (7) are silylated becoming silicon rich containing material. The silylation is performed using HMDS (hexamethyldisilazane), in vapor phase, although solutions of 10% HMCTS (hexamethylcyclotrisilazane in xylene) can also cause the resist to be silylated. Next, a second layer of low dielectric constant material (9) is deposited to a thickness between 2,000 to 10,000 Angstroms on the top surface imaging (TSI) resist, exposed silylated resist region (7) and unexposed non-silylated resist region (8). As before, the low dielectric constant material 9 consists of either an organic based material or a carbon doped silicon dioxide. Next, a cap layer (10) of silicon nitride or silicon oxynitride is deposited, to a thickness between 100 to 5,000 Angstroms, on the second layer of low dielectric constant material (9), cap layer thickness between 100 to 5,000 Angstroms. Photoresist (11) is applied and patterned over the cap layer (10) for subsequent trench opening, in a dual damascene process. Note, that at this stage in the first embodiment of the present invention, both via region (12) and trench region (13) are now defined for subsequent etching and trench/via opening in dual damascene processing. Having described both FIG. 1A and FIG. 1B, the first embodiment of this invention now shifts, due to processing options or splits, to FIG. 3 for the final dual damascene processing.

Figure 3:
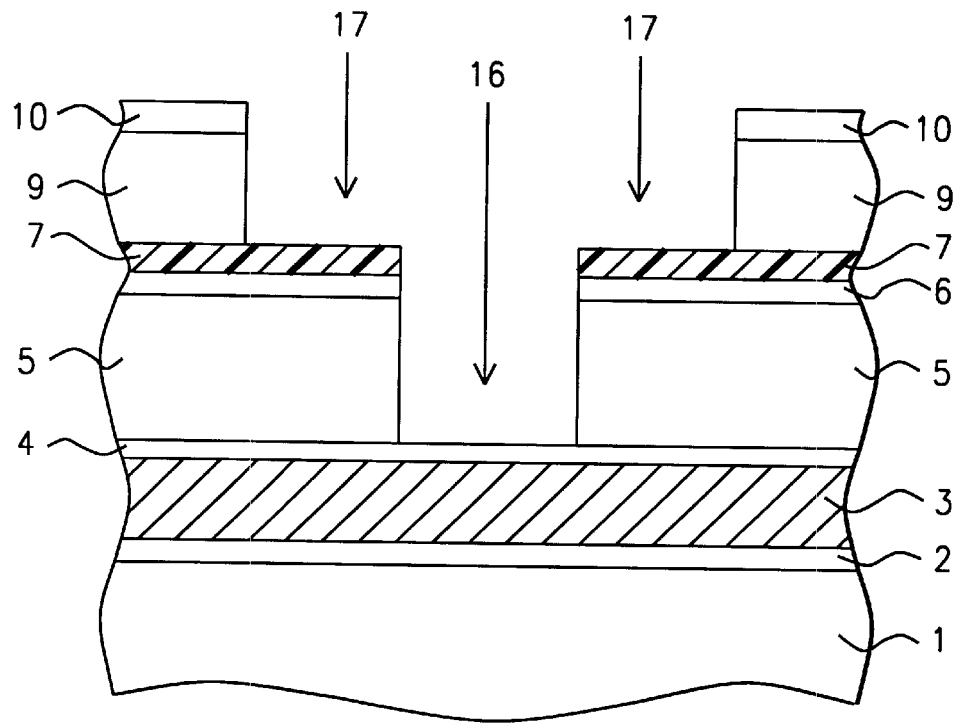
FIG. 3, which in cross-sectional representation illustrates the final part of the methods for both the first and second embodiments of the present invention.

Referring to FIG. 3, which in cross-sectional representation, shows the final result of the first embodiment of this invention. A single or multi-step step selective etching comprising, reactive ion etch (RIE) or plasmas assisted dry etching, is performed which is patterned by photoresist for trench opening (17) and silylated resist for via opening (16). The etch chemistry consists of one or more gases from the following group: oxygen, nitrogen, hydrogen, chlorine, chlorine substituted hydrocarbons, forming gas (mixtures of nitrogen and hydrogen gas), fluorine, fluorine substituted hydrocarbons, boron trichloride, argon and helium. The combined trench and via etching selectively etches through the top cap layer (10) and through the second low dielectric layer (9). In addition, the unexposed resist, organic in nature, is selectively etched away. The silylated, silicon-rich, resist regions (7) are resistant to the etch and act as a mask, patterning the opening for the via. Both exposed portions of the thin dielectric layer (6) and exposed portions of the first layer of low dielectric material (5), are selectively etched away, stopping on the bottom passivation layer (4). Hence, after the selective etch and post etch cleaning, trench opening (17) and via opening (16) are formed for dual damascene processing. Subsequent dual damascene processing steps include: removal of the bottom passivation material in the contact via region, deposition of barrier metal and copper with removal of the excess copper by chemical mechanical polish (CMP), thus forming inlaid copper interconnects and contact vias.

Figure 2A:
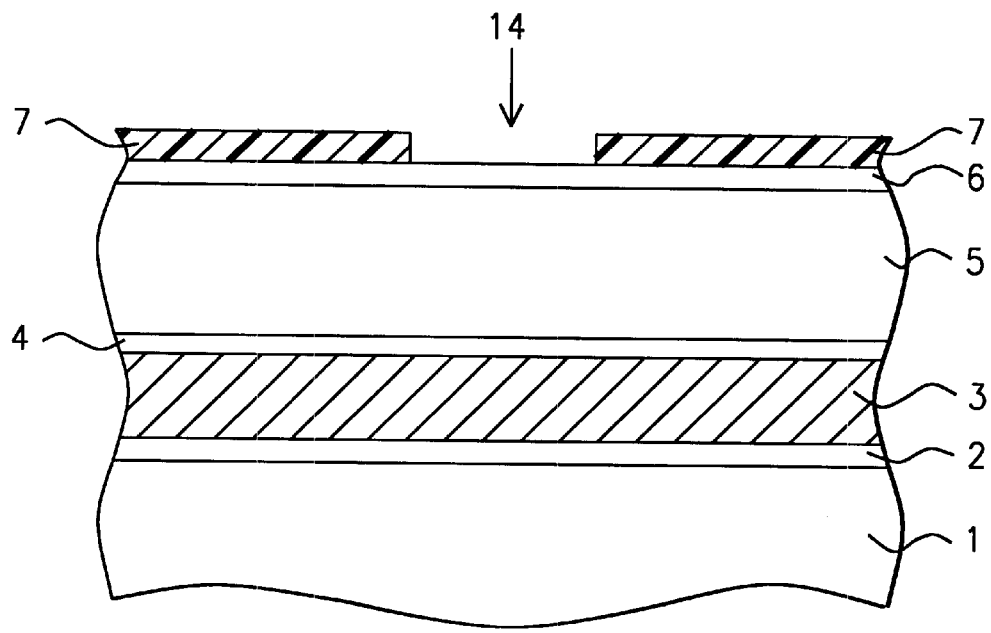
FIGS. 2A–2B, which in cross-sectional representation illustrate the first part of the method in the second embodiment of the present invention.

Referring to FIG. 2A, which in cross-sectional representation, shows a semiconductor silicon substrate 1 with an interlayer dielectric (ILD) layer 2 and with the first level of metal wiring 3 being defined, embedded in the a layer of insulator (not shown in Figs.). The second embodiment of the present invention starts with these conventional layers being provided. A bottom passivation layer 4 is deposited on the copper wiring layer 3 to a thickness between 100 to 5,000 Angstroms. Next, a low dielectric constant material layer 5 is deposited on the bottom passivation layer 4, low K material thickness between 2,000 to 10,000 Angstroms. The low dielectric constant material 5 consists of either an organic based material or a carbon doped silicon dioxide, and various combinations of the organic based material and carbon doped silicon dioxide. The organic based materials consists of, but are not restricted to, polyimide, "FLARE" (source Allied Signal, now Honeywell), "SILK" (source Dow Chemical). In the second embodiment of this invention, a thin dielectric layer 6 is deposited, to a thickness between 100 to 3,000 Angstroms, over the first layer of low dielectric constant material 5. The thin dielectric layer (6) is selected from the group consisting of silicon dioxide, silicon nitride, boron nitride, silicon carbide, barrier low K material ("BLOK", source Applied Materials), and silicon oxynitride. Next, top surface imaging (TSI) resist is placed over the thin dielectric layer 6. The resist is exposed to ultraviolet radiation, wavelength less than 248 nm, and using a photo mask, exposed regions (7) and unexposed regions (14) are formed. The exposed resist regions (7), later on in the process, become an etch stop for subsequent via formation. The top surface imaging (TSI) resist is silylated becoming silicon rich containing material. The silylation is performed using HMDS (hexamethyldisilazane), in vapor phase, although solutions of 10% HMCTS (hexamethylcyclotrisilazane in xylene) can also cause the resist to be silylated. The unexposed resist regions (14) are removed by selective etching of this non-silylated material using one or a combination of the following plasma or gas treatments: with oxygen or ozone, with $SO_2$ gas or $SO_3$ gas. Alternately, an organic solvent, e.g., cyclohexanone, acetone, may be used to selectively dissolve the unexposed resist regions (14). In this application, using oxygen or ozone, the silylated silicon-rich regions (7) may become silicon-rich silicon oxide. Note, that this process then defines the subsequent via opening. The sensitive organic low dielectric constant material (5) is protected from this etch process by the thin dielectric (6).

Figure 2B:
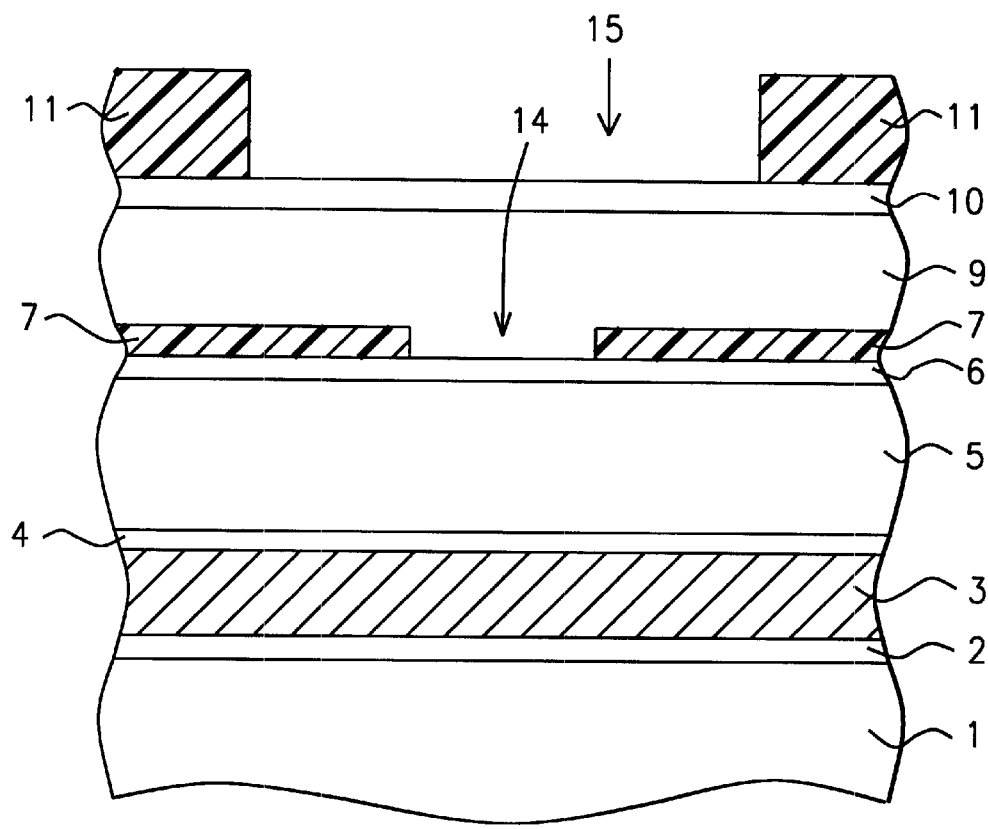

Referring to FIG. 2B, which in cross-sectional representation, shows the next set of processing steps in the second embodiment of the present invention. A second layer of low dielectric constant material (9) is deposited to a thickness between 2,000 to 10,000 Angstroms on the top surface imaging (TSI) resist, exposed silylated resist region (7) and over the thin dielectric layer (6). As before, the low dielectric constant material 9 consists of either an organic based material or a carbon doped silicon dioxide. Next, a cap layer (10) of silicon nitride or silicon oxynitride is deposited, to a thickness between 100 to 5,000 Angstroms, on the second layer of low dielectric constant material (9). Photoresist (11) is applied and patterned over the cap layer (10) for subsequent trench opening, in a dual damascene process. Note, that at this stage in the second embodiment of the present invention, both via region (14) and trench region (15) are now defined for subsequent etching and trench/via opening in dual damascene processing. Having described both FIG. 2A and FIG. 2B, the second embodiment of this invention now shifts, due to processing options or splits, to FIG. 3 for the final dual damascene processing.

Again referring to FIG. 3, which in cross-sectional representation, shows the final result of the second embodiment of this invention. A single or multi-step selective etching comprising reactive ion etch (RIE) or plasma assisted dry etching, is performed which is patterned by photoresist for trench opening (17) and silylated resist for via opening (16). The etch chemistry consists of one or more gases from the following group: oxygen, nitrogen, hydrogen, chlorine, chlorine substituted hydrocarbons, forming gas (mixtures of nitrogen and hydrogen gas), fluorine, fluorine substituted hydrocarbons, boron trichloride, argon and helium. The combined trench and via etching selectively etches through the top cap layer (10) and through the second low dielectric layer (9). The silylated, silicon-rich, resist regions (7) are resistant to the etch and act as a mask, patterning the opening for the via. Both exposed portions of the thin dielectric layer (6) and exposed portions of the first layer of low dielectric material (5), are selectively etched away, stopping on the bottom passivation layer (4). Hence, after the selective etch and post etch cleaning, trench opening (17) and via opening (16) are formed for dual damascene processing. Subsequent dual damascene processing steps include: removal of the bottom passivation material in the contact via region, deposition of barrier metal and copper with removal of the excess copper by chemical mechanical polish (CMP), thus forming inlaid copper interconnects and contact vias.

Figure 4A:
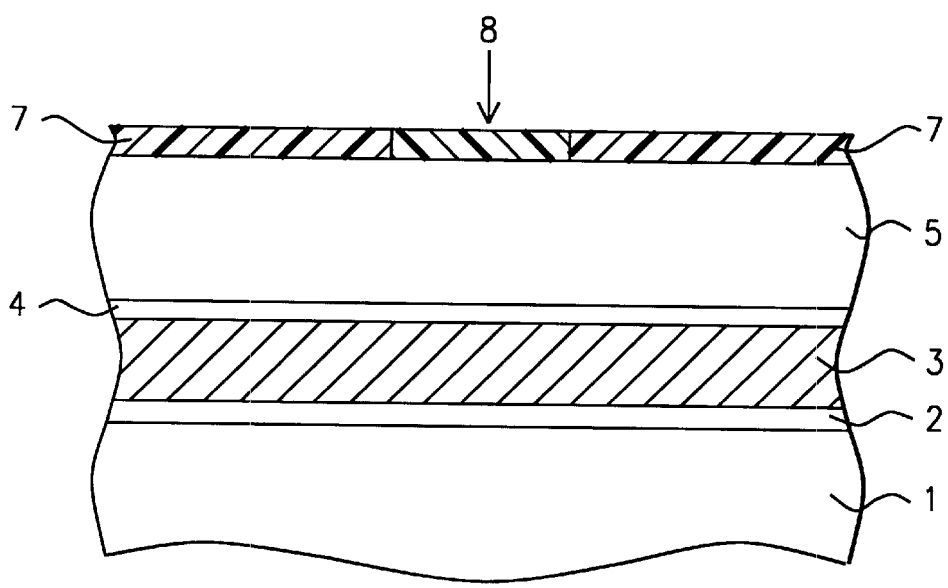
FIGS. 4A–4B, which in cross-sectional representation illustrate the first part of the method in the third embodiment of the present invention.

Referring to FIG. 4A, which in cross-sectional representation, shows a semiconductor silicon substrate 1 with an interlayer dielectric (ILD) layer 2 and with the first level of metal wiring 3 being defined, embedded in the a layer of insulator (not shown in Figs.). The third embodiment of the present invention starts with these conventional layers being provided. A bottom passivation layer 4 is deposited on the metal wiring layer 3. Next, a low dielectric constant material layer 5 is deposited, to a thickness between 2,000 to 10,000 Angstroms, on the bottom passivation layer (4). The low dielectric constant material 5 consists of either an organic based material or a carbon doped silicon dioxide, and various combinations of the organic based material and carbon doped silicon dioxide. The organic based materials consists of, but are not restricted to, polyimide, "FLARE" (source Allied Signal, now Honeywell), "SILK" (source Dow Chemical). In the third embodiment of this invention, a layer of thin dielectric utilized earlier is omitted, provided adhesion between the first layer of low dielectric constant material (5) and subsequent resist (7) is adequate. Next, top surface imaging (TSI) resist is placed on the low dielectric constant material layer (5). The resist is exposed to ultraviolet radiation, wavelength less than 248 nm, and using a photo mask, exposed regions (7) and unexposed regions (8) are depicted in FIG. 4A. The exposed resist regions (7), later on in the process, become an etch stop for subsequent via formation, while the unexposed resist regions (8) define the subsequent via opening.

Figure 4B:
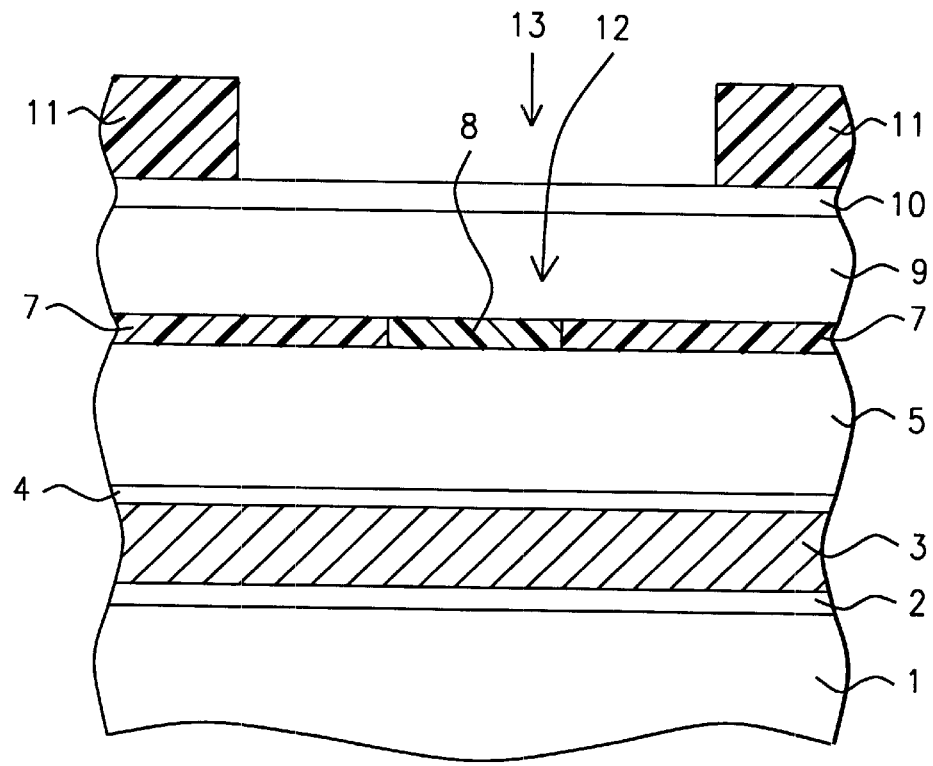

Referring to FIG. 4B, which in cross-sectional representation, shows the next set of processing steps in the third embodiment of the present invention. The top surface imaging (TSI) resist, exposed regions (7) are silylated becoming silicon rich containing material. The silylation is performed using HMDS (hexamethyldisilazane), in vapor phase, although solutions of 10% HMCTS (hexamethylcyclotrisilazane in xylene) can also cause the resist to be silylated. Next, a second layer of low dielectric constant material (9) is deposited, to a thickness between 2,000 to 10,000 Angstroms, on the top surface imaging (TSI) resist, exposed silylated resist region (7) and unexposed non-silylated resist region (8). As before, the low dielectric constant material 9 consists of either an organic based material or a carbon doped silicon dioxide. Next, a cap layer (10) of silicon nitride, or silicon oxynitride, is deposited, to a thickness between 100 to 5,000 Angstroms, on the second layer of low dielectric constant material (9). Photoresist (11) is applied and patterned over the cap layer (10) for subsequent trench opening, in a dual damascene process. Note, that at this stage in the third embodiment of the present invention, both via region (12) and trench region (13) are now defined for subsequent etching and trench/via opening in dual damascene processing. Having described both FIG. 4A and FIG. 4B, the third embodiment of this invention now shifts, due to processing options or splits, to FIG. 6 for the final dual damascene processing.

Figure 6:
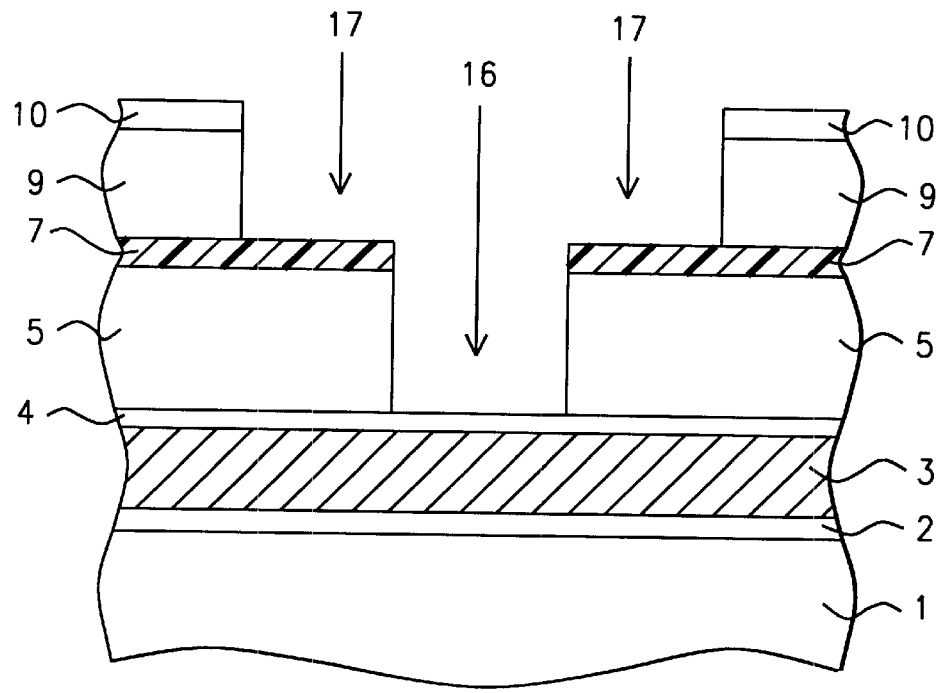
FIG. 6, which in cross-sectional representation illustrates the final part of the methods for both the third and fourth embodiments of the present invention.

Referring to FIG. 6, which in cross-sectional representation, shows the final result of the third embodiment of this invention. A single or multi-step selective etching comprising reactive ion etch (RIE) or plasma assisted dry etching, is performed which is patterned by photoresist for trench opening (17) and silylated resist for via opening (16). The etch chemistry consists of one or more gases from the following group: oxygen, nitrogen, hydrogen, chlorine, chlorine substituted hydrocarbons, forming gas (mixtures of nitrogen and hydrogen gas), fluorine, fluorine substituted hydrocarbons, boron trichloride, argon and helium. The combined trench and via etching selectively etches through the top cap layer (10) and through the second low dielectric layer (9). In addition, the unexposed resist, organic in nature, is selectively etched away. The silylated, silicon-rich, resist regions (7) are resistant to the etch and act as a mask, patterning the opening for the via. Exposed portions of the first layer of low dielectric material (5), are selectively etched away, stopping on the bottom passivation layer (4). Hence, after the selective etch and post etch cleaning, trench opening (17) and via opening (16) are formed for dual damascene processing. Subsequent dual damascene processing steps include: removal of the bottom passivation material in the contact via region, deposition of barrier metal and copper, with removal of the excess copper by chemical mechanical polish (CMP), thus forming inlaid copper interconnects and contact vias.

Figure 5A:
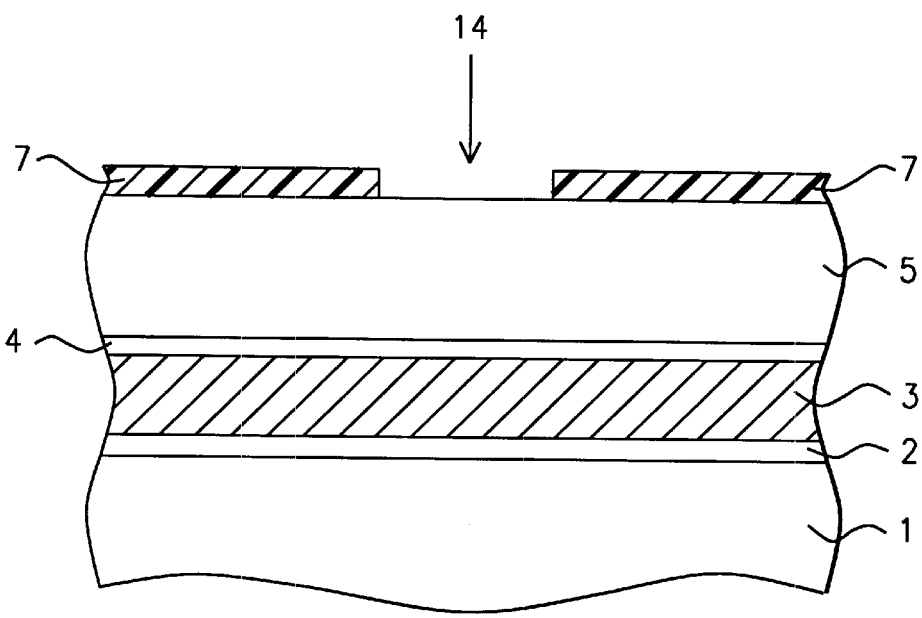
FIGS. 5A–5B, which in cross-sectional representation illustrate the first part of the method in the fourth embodiment of the present invention.

Referring to FIG. 5A, which in cross-sectional representation, shows a semiconductor silicon substrate 1 with an interlayer dielectric (ILD) layer 2 and with the first level of metal wiring 3 being defined, embedded in the a layer of insulator (not shown in Figs.). The fourth embodiment of the present invention starts with these conventional layers being provided. A bottom passivation layer 4 is deposited on the copper wiring layer 3. Next, a low dielectric constant material layer 5 is deposited, to a thickness between 2,000 to 10,000 Angstroms, on the bottom passivation layer 4. The low dielectric constant material 5 consists of either an organic based material or a carbon doped silicon dioxide, and various combinations of the organic based material and carbon doped silicon dioxide. The organic based materials consists of, but are not restricted to, polyimide, "FLARE" (source Allied Signal, now Honeywell), "SILK" (source Dow Chemical). In the fourth embodiment of this invention, a layer of thin dielectric utilized earlier is omitted, provided adhesion between the first layer of low dielectric constant material (5) and subsequent resist (7) is adequate. Next, top surface imaging (TSI) resist is placed on the low dielectric constant material layer (5). The resist is exposed to ultraviolet radiation, wavelength less than 248 nm, and using a photo mask, exposed regions (7) and unexposed regions (14) are depicted in FIG. 5A. The exposed resist regions (7), later on in the process, become an etch stop for subsequent via formation, while the unexposed resist regions (14) define the subsequent via opening. The top surface imaging (TSI) resist is silylated becoming silicon rich containing material. The silylation is performed using HMDS, (hexamethyldisilazane), in vapor phase, although solutions of 10% HMCTS (hexamethylcyclotrisilazane in xylene) can also cause the resist to be silylated. The unexposed resist regions (14) are removed by selective etching of this non-silylated material using one or a combination of plasma or gas treatments using $SO_2$ gas or $SO_3$ gas. Note, that this process then defines the subsequent via opening. The sensitive organic low dielectric constant material is now exposed to etching in this process, hence the designated use of $SO_2$ plasma or gas, or $SO_3$ plasma or gas is specified. Alternately, an organic solvent or aqueous solution which dissolves only the unexposed resist, but not the underlying organic low dielectric constant material, can be used.

Figure 5B:
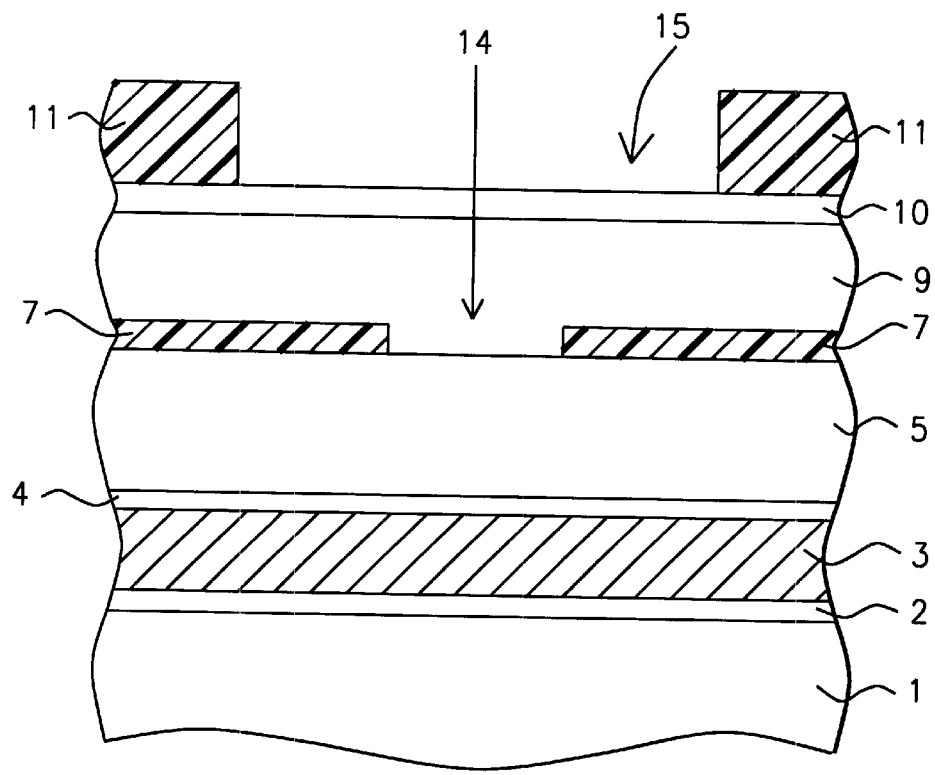

Referring to FIG. 5B, which in cross-sectional representation, shows the next set of processing steps in the fourth embodiment of the present invention. A second layer of low dielectric constant material (9) is deposited, to a thickness between 2,000 and 10,000 Angstroms, on the top surface imaging (TSI) resist, exposed silylated resist region (7) and on the exposed portion of the first layer of low dielectric material (5). As before, the low dielectric constant material 9 consists of either an organic based material or a carbon doped silicon dioxide (or a porous combination of both). Next, a cap layer (10) of silicon nitride is deposited, to a thickness between 100 to 5,000 Angstroms, on the second layer of low dielectric constant material (9). Photoresist (11) is applied and patterned over the cap layer (10) for subsequent trench opening, in a dual damascene process. Note, that at this stage in the fourth embodiment of the present invention, both via region (14) and trench region (15) are now defined for subsequent etching and trench/via opening in dual damascene processing. Having described both FIG. 5A and FIG. 5B, the fourth embodiment of this invention now shifts, due to processing options or splits, to FIG. 6 for the final dual damascene processing.

Again referring to FIG. 6, which in cross-sectional representation, shows the final result of the fourth embodiment of this invention. A single or multi-step selective etching comprising reactive ion etch (RIE) or plasma assisted dry etching, is performed which is patterned by photoresist for trench opening (17) and silylated resist for via opening (16). The etch chemistry consists of one or more gases from the following group: oxygen, nitrogen, hydrogen, chlorine, chlorine substituted hydrocarbons, forming gas (mixtures of nitrogen and hydrogen gas), fluorine, fluorine substituted hydrocarbons, boron trichloride, argon and helium. The combined trench and via etching selectively etches through the top cap layer (10) and through the second low dielectric layer (9). The silylated resist regions (7) are resistant to the etch and act as a mask, patterning the opening for the via. Exposed portions of the first layer of low dielectric material (5), are selectively etched away, stopping on the bottom passivation layer (4). Hence, after the selective etch and post etch cleaning, trench opening (17) and via opening (16) are formed for dual damascene processing. Subsequent dual damascene processing steps include: removal of the bottom passivation material in the contact via region, deposition of barrier metal and copper with removal of the excess copper by chemical mechanical polish (CMP), thus forming inlaid copper interconnects and contact vias.

A brief summary for the processing details of the silyation process, utilized in the present invention, now follow. An inert gas, e.g., nitrogen, is bubbled in liquid HMDS (hexamethyldisilazane), transporting HMDS in the vapor phase. The HMDS vapor is then introduced to the top surface imaging (TSI) resist in a reaction chamber, wherein the substrate silicon wafer is heated to between 60 to 150° C.

One process option to all four embodiments of the present invention, is to repeat all four described embodiments, but now upon a second low dielectric constant material. In effect, a dual silylation process is then possible. However, the practically of this process option or scheme, may be limited. The silicon nitride cap layer may function better as a chemical mechanical polishing (CMP) etch stop, than the silylated, silicon-rich silicon oxide, during the chemical mechanical polishing (CMP) of the excess copper. With these restrictions, a dual silyation process on top of a second low dielectric constant material is possible (as described on the first low dielectric constant material), and is listed as a process option.

While the invention has been particularly shown and described with reference to the preferred embodiments thereof, it will be understood by those skilled in the art that various changes in form and details may be made without departing from the spirit and scope of the invention.

What is claimed is:

1. A method of fabricating dual damascene copper interconnects and vias using low dielectric constant insulators comprising:

providing a substrate over which is formed an interlayer dielectric;

forming a first level of conducting wiring over said interlayer dielectric;

forming an insulating layer around said first level of conducting wiring;

forming a bottom passivation layer over said first level of conducting wiring and over said insulating layer;

forming a first intermetal dielectric layer of low dielectric constant insulating material over said bottom passivation layer;

depositing a thin dielectric layer over said low dielectric constant insulating material;

forming a layer of top surface imaging photoresist over said thin dielectric layer and over said low dielectric constant insulating material;

exposing said layer of top surface imaging photoresist to ultraviolet light using a photo mask to form exposed regions and unexposed regions;

performing a silyation process of the top surface imaging photoresist forming silicon rich material in the exposed photoresist regions, which act as a trench etch stop in subsequent dual damascene processing;

forming a second intermetal dielectric layer of low dielectric constant insulating material over said top surface imaging photoresist, which is over said thin dielectric layer, which is over said first layer of low dielectric constant insulating material;

forming a cap layer over the second intermetal dielectric layer;

in a single or multi-step etch, forming a trench in said cap layer and said second low dielectric layer, and an underlying via in said unexposed, non-silylated resist layer, said thin dielectric layer and said first layer of low dielectric constant material.

2. The method of claim 1, wherein said substrate is semiconductor single crystal silicon or an IC module.

3. The method of claim 1, wherein said bottom passivation layer is selected from the group consisting of silicon nitride, silicon oxynitride, barrier low K material ("BLOK", source Applied Materials), and silicon carbide, in a thickness from approximately 100 to 5,000 Angstroms and is used as an etch stop in the selective etch for trench and via opening.

4. The method of claim 1, wherein the low dielectric constant insulating material for intermetal dielectric layers is selected from the group consisting of organic based or carbon doped silicon dioxide, or a porous combination of the above, in a thickness from approximately 2,000 to 10,000 Angstroms.

5. The method of claim 1, wherein said thin dielectric layer is selected from the group consisting of silicon oxide, silicon nitride, silicon carbide, silicon oxynitride, in a thickness from approximately 100 to 5,000 Angstroms.

6. The method of claim 1, wherein said top surface imaging resist (TSI) is in a thickness from approximately 100 to 5,000 Angstroms and is exposed by ultraviolet light, less than 248 nm wavelength.

7. The method of claim 1, wherein said top surface imaging resist is silylated by HMDS (hexamethyldisilazane), in vapor phase, and forms an etch stop for via formation in dual damascene.

8. The method of claim 1, wherein said cap layer is selected from the group consisting of silicon nitride, or silicon oxynitride, to a thickness between 100 to 5,000 Angstroms.

9. The method of claim 1, wherein the single or multi-step etch is comprised of a reactive ion etch (RIE) or plasma assisted dry etching, with an etch chemistry selected from the group consisting of, one or more gases from the following: oxygen, nitrogen, hydrogen, chlorine, chlorine substituted hydrocarbons, forming gas (mixtures of nitrogen and hydrogen gas), fluorine, fluorine substituted hydrocarbons, boron trichloride, argon and helium and stopping on the bottom passivation layer.

10. The method of claim 1, wherein the dual damascene trench/via is filled with copper and lined with a diffusion barrier.

11. The method of claim 1, wherein multilevel layers are fabricated by repeating the process.

12. A method of fabricating dual damascene copper interconnects and vias using low dielectric constant insulators comprising:

providing a substrate over which is formed an interlayer dielectric;

forming a first level of conducting wiring over said interlayer dielectric;

forming an insulating layer around said first level of conducting wiring;

forming a bottom passivation layer over said first level of conducting wiring and over said insulating layer;

forming a first intermetal dielectric layer of low dielectric constant insulating material over said bottom passivation layer;

depositing a thin dielectric layer over said low dielectric constant insulating material;

forming a layer of top surface imaging photoresist over said thin dielectric layer and over said low dielectric constant insulating material;

exposing said layer of top surface imaging photoresist to ultraviolet light using a photo mask to form exposed regions and unexposed regions;

performing a silylation process of the top surface imaging photoresist forming silicon rich material in the exposed photoresist regions, which act as a trench etch stop in subsequent dual damascene processing;

etching of the non-silylated unexposed top surface imaging photoresist;

forming a second intermetal dielectric layer of low dielectric constant insulating material over said top surface imaging photoresist, which is over said thin dielectric layer, which is over said first layer of low dielectric constant insulating material;

forming a cap layer over the second intermetal dielectric layer;

in a single or multi-step etch, forming a trench in said cap layer and said second low dielectric layer, and an underlying via in said thin dielectric layer and said first layer of low dielectric constant material.

13. The method of claim 12, wherein said substrate is semiconductor single crystal silicon or an IC module.

14. The method of claim 12, wherein said bottom passivation layer is selected from the group consisting of silicon nitride, silicon oxynitride, barrier low K material ("BLOK", source Applied Materials), and silicon carbide, in a thickness from approximately 100 to 5,000 Angstroms and is used as an etch stop in the selective etch for trench and via opening.

15. The method of claim 12, wherein the low dielectric constant insulating material for intermetal dielectric layers is selected from the group consisting of organic based or carbon doped silicon dioxide, or a porous combination of the above, in a thickness from approximately 2,000 to 10,000 Angstroms.

16. The method of claim 12, wherein said thin dielectric layer is selected from the group consisting of silicon oxide, silicon nitride, silicon carbide, silicon oxynitride, in a thickness from approximately 100 to 5,000 Angstroms.

17. The method of claim 12, wherein said top surface imaging resist (TSI) is in a thickness from approximately 100 to 5,000 Angstroms and is exposed by ultraviolet light, less than 248 nm wavelength.

18. The method of claim 12, wherein said top surface imaging resist is silylated by HMDS (hexamethyldisilazane), in vapor phase, and forms an etch stop for via formation in dual damascene.

19. The method of claim 12, wherein the etch of unexposed, non-silylated top surface imaging resist, over said thin dielectric layer, is selected from the group consisting of $O_2$ plasma, ozone plasma or gas, $SO_2$ plasma or gas, $SO_3$ plasma or gas, and low dielectric material beneath is protected by said thin dielectric.

20. The method of claim 12, wherein said cap layer is selected from the group consisting of silicon nitride, or silicon oxynitride, to a thickness between 100 to 5,000 Angstroms.

21. The method of claim 12, wherein the single or multi-step etch is comprised of a reactive ion etch (RIE) or plasma assisted dry etching, with an etch chemistry selected from the group consisting of, one or more gases from the following: oxygen, nitrogen, hydrogen, chlorine, chlorine substituted hydrocarbons, forming gas (mixtures of nitrogen and hydrogen gas), fluorine, fluorine substituted hydrocarbons, boron trichloride, argon and helium and stopping on the bottom passivation layer.

22. The method of claim 12, wherein the dual damascene trench/via is filled with copper and lined with a diffusion barrier.

23. The method of claim 12, wherein multilevel layers are fabricated by repeating the process.

24. A method of fabricating dual damascene copper interconnects and vias using low dielectric constant insulators comprising:

providing a substrate over which is formed an interlayer dielectric;

forming a first level of conducting wiring over said interlayer dielectric;

forming an insulating layer around said first level of conducting wiring;

forming a bottom passivation layer over said first level of conducting wiring and over said insulating layer;

forming a first intermetal dielectric layer of low dielectric constant insulating material over said bottom passivation layer;

forming a layer of top surface imaging photoresist over said low dielectric constant insulating material;

exposing said layer of top surface imaging photoresist to ultraviolet light using a photo mask to form exposed regions and unexposed regions;

performing a silylation process of the top surface imaging photoresist forming silicon rich material in the exposed photoresist regions, which act as a trench etch stop in subsequent dual damascene processing;

forming a second intermetal dielectric layer of low dielectric constant insulating material over said top surface imaging photoresist, which is over said first layer of low dielectric constant insulating material;

forming a cap layer over the second intermetal dielectric layer;

in a single or multi-step etch, forming a trench in said cap layer and said second low dielectric layer, and an underlying via in said unexposed, non-silylated resist layer, and said first layer of low dielectric constant material.

25. The method of claim 24, wherein said substrate is semiconductor single crystal silicon or an IC module.

26. The method of claim 24, wherein said bottom passivation layer is selected from the group consisting of silicon nitride, silicon oxynitride, barrier low K material ("BLOK", source Applied Materials), and silicon carbide, in a thickness from approximately 100 to 5,000 Angstroms and is used as an etch stop in the selective etch for trench and via opening.

27. The method of claim 24, wherein the low dielectric constant insulating material for intermetal dielectric layers is selected from the group consisting of organic based or carbon doped silicon dioxide, or a porous combination of the above, in a thickness from approximately 2,000 to 10,000 Angstroms.

28. The method of claim 24, wherein said top surface imaging resist (TSI) is in a thickness from approximately 100 to 5,000 Angstroms and is exposed by ultraviolet light, less than 248 n wavelength.

29. The method of claim 24, wherein said top surface imaging resist is silylated by HMDS (hexamethyldisilazane), in vapor phase, and forms an etch stop for via formation in dual damascene.

30. The method of claim 24, wherein said cap layer is selected from the group consisting of silicon nitride, or silicon oxynitride, to a thickness between 100 to 5,000 Angstroms.

31. The method of claim 24, wherein the single or multi-step etch is comprised of a reactive ion etch (RIE) or plasma assisted dry etching, with an etch chemistry selected from the group consisting of, one or more gases from the following: oxygen, nitrogen, hydrogen, chlorine, chlorine substituted hydrocarbons, forming gas (mixtures of nitrogen and hydrogen gas), fluorine, fluorine substituted hydrocarbons, boron trichloride, argon and helium and stopping on the bottom passivation layer.

32. The method of claim 24, wherein the dual damascene trench/via is filled with copper and lined with a diffusion barrier.

33. The method of claim 12, wherein multilevel layers are fabricated by repeating the process.

34. A method of fabricating dual damascene copper interconnects and vias using low dielectric constant insulators comprising:

providing a substrate over which is formed an interlayer dielectric;

forming a first level of conducting wiring over said interlayer dielectric;

forming an insulating layer around said first level of conducting wiring;

forming a bottom passivation layer over said first level of conducting wiring and over said insulating layer;

forming a first intermetal dielectric layer of low dielectric constant insulating material over said bottom passivation layer;

forming a layer of top surface imaging photoresist over said low dielectric constant insulating material;

exposing said layer of top surface imaging photoresist to ultraviolet light using a photo mask to form exposed regions and unexposed regions;

performing a silylation process of the top surface imaging photoresist forming silicon rich material in the exposed photoresist regions, which act as a trench etch stop in subsequent dual damascene processing;

etching the non-silylated unexposed top surface imaging photoresist;

forming a second intermetal dielectric layer of low dielectric constant insulating material over said top surface imaging photoresist, which is over said first layer of low dielectric constant insulating material;

forming a cap layer over the second intermetal dielectric layer;

in a single or multi-step etch, forming a trench in said cap layer and said second low dielectric layer, and an underlying via in said first layer of low dielectric constant material.

35. The method of claim 34, wherein said substrate is semiconductor single crystal silicon or an IC module.

36. The method of claim 34, wherein said bottom passivation layer is selected from the group consisting of silicon nitride, silicon oxynitride, barrier low K material ("BLOK", source Applied Materials), and silicon carbide, in a thickness from approximately 100 to 5,000 Angstroms and is used as an etch stop in the selective etch for trench and via opening.

37. The method of claim 34, wherein the low dielectric constant insulating material for intermetal dielectric layers is selected from the group consisting of organic based or carbon doped silicon dioxide, or a porous combination of the above, in a thickness from approximately 2,000 to 10,000 Angstroms.

38. The method of claim 34, wherein said top surface imaging resist (TSI) is in a thickness from approximately 100 to 5,000 Angstroms and is exposed by ultraviolet light, less than 248 nm wavelength.

39. The method of claim 34, wherein said top surface imaging resist is silylated by HMDS (hexamethyldisilazane), in vapor phase, and forms an etch stop for via formation in dual damascene.

40. The method of claim 34, wherein the etch of unexposed, non-silylated top surface imaging resist, over low dielectric constant material, is performed using $SO_2$ plasma or gas, or $SO_3$ plasma or gas, to protect the low dielectric material below.

41. The method of claim 34, wherein said cap layer is selected from the group consisting of silicon nitride, or silicon oxynitride, to a thickness between 100 to 5,000 Angstroms.

42. The method of claim 34, wherein the single or multi-step etch is comprised of a reactive ion etch (RIE) or plasma assisted dry etching, with an etch chemistry selected from the group consisting of, one or more gases from the following: oxygen, nitrogen, hydrogen, chlorine, chlorine substituted hydrocarbons, forming gas (mixtures of nitrogen and hydrogen gas), fluorine, fluorine substituted hydrocarbons, boron trichloride, argon and helium and stopping on the bottom passivation layer.

43. The method of claim 34, wherein the dual damascene trench/via is filled with copper and lined with a diffusion barrier.

44. The method of claim 34, wherein multilevel layers are fabricated by repeating the process.

* * * * *